United States Patent [19]
Kim et al.

[11] Patent Number: 6,159,792
[45] Date of Patent: Dec. 12, 2000

[54] METHOD FOR FORMING A CAPACITOR OF SEMICONDUCTOR DEVICE

[75] Inventors: Sang Wook Kim; Dong Myung Lee; Ik Soo Choi, all of Ichon-shi, Rep. of Korea

[73] Assignee: Hyundai Electronics Industries Co., Ltd., Rep. of Korea

[21] Appl. No.: 09/224,042

[22] Filed: Dec. 30, 1998

[30] Foreign Application Priority Data

Dec. 30, 1997 [KR] Rep. of Korea ..................... 97-77880

[51] Int. Cl.[7] ............................................. H01L 21/8242
[52] U.S. Cl. ........................................... 438/254; 438/255
[58] Field of Search ........................... 438/238, 253–256, 438/381, 396–399

[56] References Cited

U.S. PATENT DOCUMENTS

| | | | |
|---|---|---|---|
| 4,814,845 | 3/1989 | Kurtz | 357/26 |
| 5,354,705 | 10/1994 | Mathews et al. | 437/52 |
| 5,438,011 | 8/1995 | Blalock et al. | 437/52 |
| 5,444,653 | 8/1995 | Nagasawa et al. | 365/149 |
| 5,498,562 | 3/1996 | Dennison et al. | 437/52 |
| 5,556,802 | 9/1996 | Bakeman, Jr. et al. | |
| 5,665,626 | 9/1997 | Cronin | 438/396 |
| 5,804,489 | 9/1998 | Yang et al. | 438/396 |

FOREIGN PATENT DOCUMENTS

| | | | |
|---|---|---|---|
| 5771991 | 4/1982 | Japan | H01L 21/88 |
| 6114968 | 1/1986 | Japan | H01L 21/28 |
| 61228654 | 9/1986 | Japan | C23F 4/00 |
| 61301245 | 12/1986 | Japan | H01L 29/80 |
| 62224368 | 9/1987 | Japan | H01L 21/306 |
| 04149388 | 6/1992 | Japan | H01L 21/302 |

*Primary Examiner*—Jey Tsai
*Attorney, Agent, or Firm*—Blakely Sokoloff Taylor & Zafman

[57] ABSTRACT

An improved method for forming a capacitor which is capable of increasing cell capacitance is disclosed. The capacitor easily formed a sequential two-step etching processes. The two-step etching include a selectively etching to form the contact hole for exposing an etch stop layer between gate electrodes, and an isotopically dry etching to maximize capacitor surface area without cleaning process after the selectively etching, an interlayer insulating layer being patterned in a manner which produces inner interlayer contact sidewalls having standing wave ripples and removes the exposed etch stop layer. As a result, it is found that the capacitor which is obtained by a simple and easy two-step dry etching exhibits an increased capacitor surface area. Furthermore, it is possible to form the stacked capacitor having sufficiently high storage capacitance without increasing the contact resistance.

14 Claims, 4 Drawing Sheets

METHOD FOR FORMING A CAPACITOR OF SEMICONDUCTOR DEVICE

FIELD OF THE INVENTION

The present invention relates generally to a method for manufacturing semiconductor devices, and more particularly to a method of forming a capacitor which is capable of increasing cell capacitance.

DESCRIPTION OF THE PRIOR ARTS

As semiconductor device dimensions approach the deep submicron regime, several problems arise. For example, conventional submicrometer devices often suffer from high contact resistance which offsets the advantage gained from fine patterns. The reduction of the contact hole size gives rise to high contact resistance, which in turn lowers characteristics of the device.

In an effort to avoid aforementioned problems, various kinds of self align contact (SAC) method have been disclosed. Specifically, the SAC method using silicon nitride layer as an etching stopper has considerable advantage compare to conventional self align method.

As dynamic random access memories (DRAMs) increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as cylindrical and fin-type capacitors, and a metal-stable polysilicon (MPS) capacitor having hemispherical grains. However, the formation method of the MPS capacitor involves sophisticated etching processes. Further, since the hemispherical grains of the MPS capacitor are drop during cleaning process, the DRAM cause to short.

To avoid aforementioned problems, a selective MPS technique using grain migration has been proposed. This method is to form the MPS layer by changing an amorphous silicon to a polycrystalline silicon. Thus, this method has sophisticated process conditions and has limitation that it is not enforce dry etching using a fluorine gas.

FIG. 1 is a photograph illustrating a scanning electron microscopy (SEM) profile in accordance with conventional stacked cylindrical capacitor. As shown in FIG. 1, it has limitation to increase the surface area of a charge storage electrode.

Ultimately, the conventional technologies have disadvantageous in that low contact resistance cannot coexist with high cell capacitance. Thus, what is needed is to develop a simple and easy process together with maximizing the capacitor surface area.

SUMMARY OF THE INVENTION

It is therefore an object of the present invention to provide a method for forming a capacitor of semiconductor devices which is capable of increasing capacitor surface area without increasing contact resistance.

It is another object of the present invention to provide a method for manufacturing a capacitor having sufficiently high storage capacitance, and inexpensive and simple to manufacture.

According to a preferred embodiment of this invention, there is provided an improved method for forming a capacitor, said method comprising the steps of: (a) preparing a semiconductor substrate having a gate electrode to which electrical connection to a capacitor is to be made and a protecting oxide layer; (b) sequentially forming an etch stop layer and an interlayer insulating layer on an entire surface of said semiconductor substrate; (c) patterning the interlayer insulating layer using a sequential two-step etching to form a contact hole, wherein the two-step etching comprises the steps of; (c-1) selectively etching to form the contact hole for exposing the etch stop layer between said gate electrodes, and (c-2) isotopically dry etching to maximize capacitor surface area without cleaning process after said selectively etching, the interlayer insulating layer being patterned in a manner which produces inner interlayer contact sidewalls having standing wave ripples and removes the exposed etch stop layer; (d) forming a conductive layer over said interlayer contact sidewalls and the exposed protecting oxide layer and substrate; and (e) removing the remained etch stop layer and interlayer insulating layer.

Preferably, the etch stop layer comprises silicon nitride, the interlayer insulating layer comprises BPSG (borophosphosilicate glass) or PSG (phosphosilicate glass), and the conductive layer comprises doped polysilicon.

Preferably, the isotopically dry etching is used method selected from the group consisting of an inductively coupled plasma (ICP), a microwave down stream (MDS), an electron cyclotron resonance (ECR), a transformer coupled plasma (TCP) method, and HELICAL method, the ICP being performed in the power range of 300 to 3000 watts, in the pressure range of 200 to 3000 mTorr, in the substrate temperature range of 0° C. to 300° C., and in the gas flow rate range of 100 to 500 sccm, and the MDS method being carried out in the power range of 500 to 3000 watts.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention.

BRIEF DESCRIPTION OF THE DRAWINGS

The above and other and features of the present invention will become apparent from the following description of the preferred embodiments given in conjunction with the accompanying drawings, in which.

DETAILED DESCRIPTION OF THE PREFERRED EMBODIMENTS

Hereinafter, referring to FIGS. 2a to 2c, forming processes of a capacitor in accordance with preferred embodiment will be described in detail.

Figure 1:
FIG. 1 is a photograph illustrating a scanning electron microscopy (SEM) profile in accordance with the conventional stacked cylindrical capacitor.
Figure 2A:
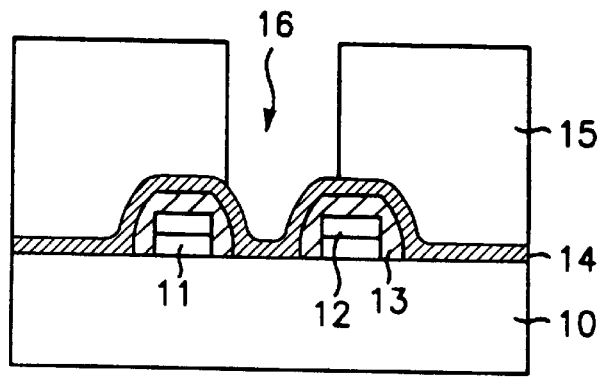
FIGS. 2a to 2c are schematic cross-sectional process flow diagrams illustrating a forming method of capacitors in accordance with the present invention.

Referring to FIG. 2a, a gate insulator and a gate material are sequentially formed on a semiconductor substrate 10 and then etched by photolithographic process using a photoresist pattern as a mask. As a result, a gate insulating layer 11 and a gate electrode 12 patterns are sequentially formed on a semiconductor substrate 10. Then, a protecting oxide layer 13 is formed on the gate electrode 12 and at both sidewalls of the gate electrode 12 and the gate insulating layer 11.

An etch stop layer 14 is provided over the protecting oxide layer 13 and the substrate 10. A preferred material used as the etch stop layer 14 is a silicon nitride ($Si_3N_4$). An interlayer insulating layer 15 is formed on the entire surface of the resultant structure, and then the interlayer insulating layer 15 is patterned as shown to form a contact hole 16. Preferably, BPSG (borophosphosilcate glass) or PSG (phosphosilicate glass) used as the interlayer insulating layer 15.

Figure 2B:
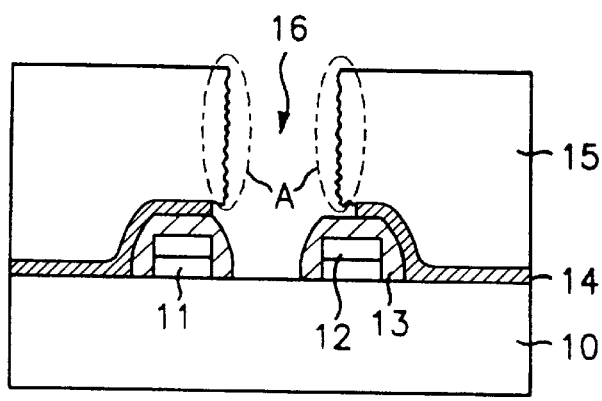

Subsequently, without cleaning process, the interlayer insulating layer 15 is isotopically dry etched in a manner which produces inner interlayer contact sidewalls 'A' having standing wave ripples (or prominence and depression) which are utilized to increase capacitor surface area as will be apparent subsequently, as shown in FIG. 2b. At this time, that is, during the isotopically dry etching, the exposed etch stop layer 14 is also removed.

That is, in this invention, the interlayer insulating layer 14 is patterned by a sequential two-step etching to form a contact hole 16, wherein the two-step etching comprises the steps of: (1) selectively etching to form the contact hole 16 for exposing the etch stop layer 14 between said gate electrodes 12; and (2) isotopically dry etching to maximize capacitor surface area without cleaning process after said selectively etching, the interlayer insulating layer 15 being patterned in a manner which produces inner interlayer contact sidewalls 'A' having standing wave ripples and removes the exposed etch stop layer 14.

The formation of inner interlayer contact sidewalls 'A' having standing wave ripples is determined by processing parameters of the isotropic dry etching method. For example, there are an inductively coupled plasma (ICP) method, a microwave down stream (MDS) method, an electron cyclotron resonance (ECR) method, a transformer coupled plasma (TCP) method, and HELICAL method.

In the preferred embodiment of this invention, the isotropic dry etching is used the ICP equipment mounted a faraday shield. At this time, process conditions are as follows; its power is in the range of 300 to 3000 watts, the pressure is in the range of 200 to 3000 mTorr, the major etchant uses $NF_3$ gas, the substrate temperature is in the range of 0 to 300) 4, the gas flow rate is in the range of 100 to 500 sccm, and the etching time is about 45 seconds.

Also, the MDS equipment can be used in the power range of 500 to 3000 watts.

Also, this embodiment can be used fluorine gas members, such as $NF_3$, $CF_4$, $CH_3F$, $CHF_3$, $C_2F_6$, $CH_2F_2$, $C_3F_8$, $C_4F_8$, or $C_5F_8$ as major etchants for the isotopically dry etching. Additionally, in order to increasing the etch rate between the interlayer insulating layer 15 and the underlying etch stop layer 14, $N_2$ or $NH_3$ gas is added in the fluorine gas etchants. The isotopically dry etching can be added Ar or He gas as a carrier gas.

Figure 2C:
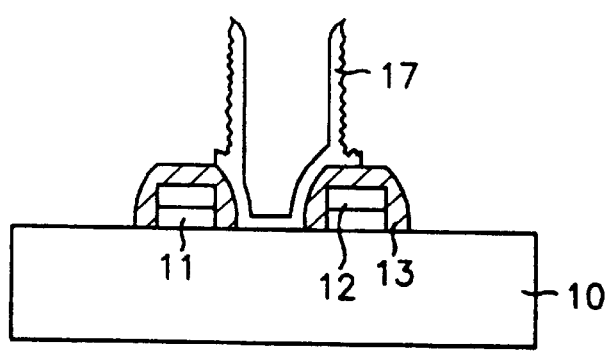

Referring to FIG. 2c, a conductive layer made of doped polysilicon is formed over the interlayer contact sidewalls 'A' and the exposed protecting oxide layer 13 and substrate 10, and the remained etch stop layer 14 and the remained interlayer insulating layer 15 are removed, thereby forming a charge storage electrode 17 having standing wave ripples or prominence and depression portion for increasing the surface area of the storage electrode 17.

Hereinafter, the properties of the capacitor were analyzed by SEM (scanning electron microscopy) referring to FIGS. 3 and 4.

Figure 3A:
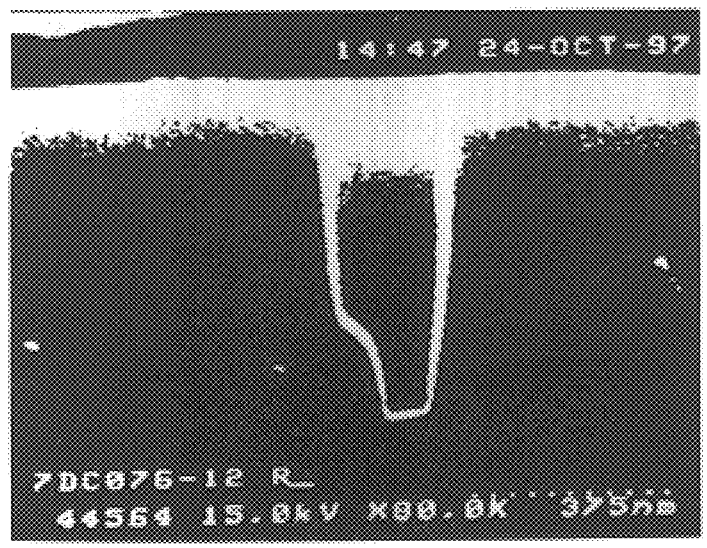
FIG. 3a is a photograph illustrating a SEM profile of a contact hole using BPSG in accordance with the conventional method.
Figure 3B:
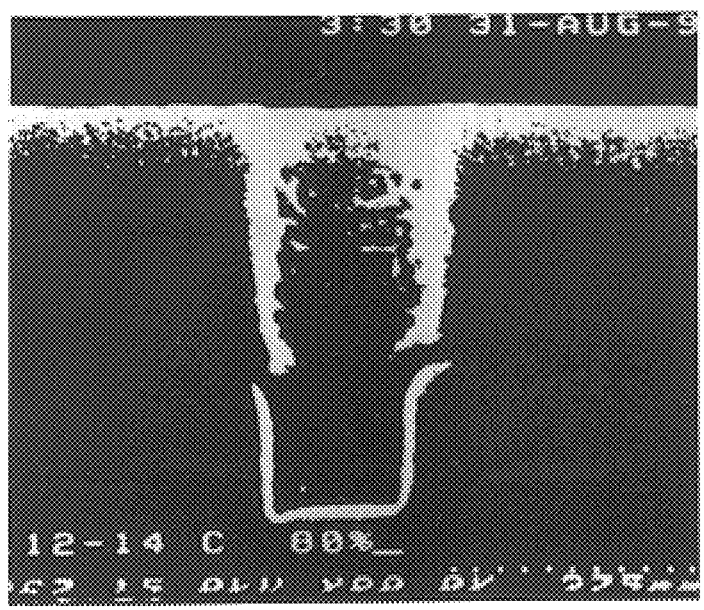
FIG. 3b is a photograph illustrating a SEM profile of a contact hole using BPSG in accordance with the present invention.

FIG. 3a shows SEM photograph of a contact hole which is used BPSG as the interlayer insulating layer according to the conventional method, and FIG. 3b illustrates SEM photograph of a contact hole which is used BPSG as the interlayer insulating layer in accordance with the present invention.

As shown in FIGS. 3a and 3b, it is found that interlayer contact sidewalls according to this invention using two-step etching precess are easily formed.

Figure 4A:
FIG. 4a is a photograph illustrating a SEM profile of a contact hole using PSG in accordance with the conventional art.
Figure 4B:
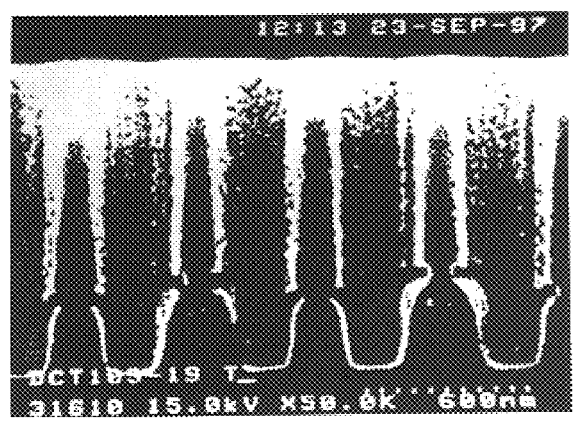
FIG. 4b is a photograph illustrating a SEM profile of a contact hole using PSG in accordance with an embodiment of the present invention.

FIG. 4a is a photograph illustrating a SEM profile of a contact hole using PSG in accordance with the conventional art, and FIG. 4b is a photograph illustrating a SEM profile of a contact hole using PSG in accordance with an embodiment of the present invention.

Figure 4C:
FIG. 4c is a photograph illustrating a SEM profile of a contact hole using PSG in accordance with another embodiment of the present invention.

As shown in FIGS. 4a and 4b, it is also found that interlayer contact sidewalls according to this invention using two-step etching precess are easily formed. Additionally, FIG. 4c shows SEM photograph of a contact hole using PSG in accordance with another embodiment of the present invention.

In this embodiment, after forming interlayer contact sidewalls according to this invention using two-step etching, a wet etching process is performed so as to further increase the size of standing wave ripples of interlayer contact sidewalls. At this time, the etching solution of the wet etching can be used buffered oxide etchant (BOE) or HF etching solution for 10 seconds.

According to the present invention as described above, it is found that the stacked capacitor which is obtained by a simple and easy two-step dry etching exhibits an increased capacitor surface area.

Furthermore, it is possible to form the stacked capacitor having sufficiently high storage capacitance without increasing the contact resistance.

While the present invention has been disclosed with respect to certain preferred embodiments only, other modifications and variations may be made without departing from the spirit and scope of the present invention as set forth in the following claims.

What is claimed is:

1. A method for forming a capacitor of semiconductor devices, said method comprising the steps of:
   a) preparing a semiconductor substrate having a gate electrode to which electrical connection to a capacitor is to be made and a protecting oxide layer;
   b) sequentially forming an etch stop layer and an interlayer insulating layer on an entire surface of said semiconductor substrate;
   c) patterning the interlayer insulating layer using a sequential two-step etching to form a contact hole, wherein the two-step etching comprises the steps of:
      (c-1) selectively etching to form the contact hole for exposing the etch stop layer between said gate electrodes, and (c-2) isotopically dry etching to maximize capacitor surface area without cleaning process after said selectively etching, the interlayer insulating layer being patterned in a manner which produces inner interlayer contact sidewalls having standing wave ripples and removes the exposed etch stop layer;

d) forming a conductive layer over said interlayer contact sidewalls and the exposed protecting oxide layer and substrate; and e) removing the remained etch stop layer and interlayer insulating layer.

2. The method for forming a capacitor of semiconductor devices according to claim 1, wherein said etch stop layer is silicon nitride.

3. The method for forming a capacitor of semiconductor devices according to claim 1, wherein said interlayer insulating layer is insulators thereof selected from BPSG (borophosphosilicate glass) and PSG (phosphosilicate glass).

4. The method for forming a capacitor according to claim 1, wherein said isotopically dry etching is used method selected from the group consisting of an inductively coupled plasma (ICP), a microwave down stream (MDS), an electron cyclotron resonance (ECR), a transformer coupled plasma (TCP) method, and HELICAL method.

5. The method for forming a capacitor according to claim 4, wherein said ICP using for the isotopically dry etching is performed in the power range of 300 to 3000 watts, in the pressure range of 200 to 3000 mTorr, in the substrate temperature range of 0° C. to 300° C., and in the gas flow rate range of 100 to 500 sccm.

6. The method for forming a capacitor according to claim 4, wherein said MDS method using for the isotopically dry etching is carried out in the power range of 500 to 3000 watts.

7. The method for forming a capacitor according to claim 1, wherein said etchants of the isotopically dry etching used fluorine gas members selected from the group consisting of $NF_3$, $CF_4$, $CH_3F$, $CHF_3$, $C_2F_6$, $CH_2F_2$, $C_3F_8$, $C_4F_8$, or $C_5F_8$.

8. The method for forming a capacitor according to claim 7, wherein said fluorine gas etchants further comprise $N_2$ gas.

9. The method for forming a capacitor according to claim 7, wherein said fluorine gas etchants further comprise $NH_3$ gas.

10. The method for forming a capacitor according to claim 1, wherein said isotopically dry etching is added a carrier gas made of Ar or He.

11. The method for forming a capacitor according to claim 1, wherein said conductive layer comprises doped polysilicon.

12. The method for forming a capacitor according to claim 1, further comprise the step of wet etching after the step of (e), so as to increase the surface area of the capacitor.

13. The method for forming a capacitor according to claim 12, wherein said etching solution of the wet etching is buffered oxide etchant (BOE).

14. The method for forming a capacitor according to claim 12, wherein said wet etching is performed using HF etching solution for 10 seconds.

* * * * *